US009692100B2

(12) United States Patent
Baba et al.

(10) Patent No.: US 9,692,100 B2
(45) Date of Patent: Jun. 27, 2017

(54) MULTI-LAYER RESIN SUBSTRATE HAVING GROUNDING CONDUCTORS CONFIGURED TO FORM TRIPLATE LINE SECTIONS AND MICROSTRIP SECTIONS

(71) Applicant: Murata Manufacturing Co., Ltd., Nagaokakyo-shi, Kyoto-fu (JP)

(72) Inventors: Takahiro Baba, Nagaokakyo (JP); Nobuo Ikemoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/823,054

(22) Filed: Aug. 11, 2015

(65) Prior Publication Data
US 2015/0351222 A1 Dec. 3, 2015

Related U.S. Application Data

(63) Continuation of application No. PCT/JP2014/054409, filed on Feb. 25, 2014.

(30) Foreign Application Priority Data

Mar. 26, 2013 (JP) .................................. 2013-063749

(51) Int. Cl.
*H01P 3/08* (2006.01)
*H05K 1/02* (2006.01)
(Continued)

(52) U.S. Cl.
CPC .............. *H01P 3/085* (2013.01); *H01L 25/10* (2013.01); *H01L 25/18* (2013.01); *H01P 3/08* (2013.01);
(Continued)

(58) Field of Classification Search
CPC .......... H01P 3/085; H01P 3/087; H01P 3/088; H01P 1/02; H05K 1/0298; H05K 1/0393
(Continued)

(56) References Cited

U.S. PATENT DOCUMENTS 5,317,292 A * 5/1994 Leeb ....................... H01P 3/085
29/830
5,631,446 A * 5/1997 Quan ...................... H01R 12/62
174/254
(Continued)

FOREIGN PATENT DOCUMENTS

JP 5-15508 U 2/1993
JP 05-283914 A 10/1993
(Continued)

OTHER PUBLICATIONS

Official Communication issued in International Patent Application No. PCT/JP2014/054409, mailed on May 13, 2014.
Official Communication issued in corresponding Japanese Patent Application No. 2014-555031, mailed on Jan. 27, 2015.

*Primary Examiner* — Benny Lee
(74) *Attorney, Agent, or Firm* — Keating & Bennett, LLP

(57) ABSTRACT

A flat cable includes a plurality of resin layers that are flexible and stacked together, a line conductor, and grounding conductors. The flat cable includes a triplate line in which both surfaces of the line conductor oppose the corresponding grounding conductors, and a microstrip line in which only one of the surfaces of the line conductor opposes the corresponding grounding conductor. A width of the line conductor in the microstrip line is greater than a width of the line conductor in the triplate line, and the flat cable is bent at a position where the microstrip line is provided.

19 Claims, 8 Drawing Sheets

(51) Int. Cl.
*H01L 25/10* (2006.01)
*H01L 25/18* (2006.01)
*H05K 1/14* (2006.01)

(52) U.S. Cl.
CPC ............. *H01P 3/082* (2013.01); *H05K 1/025* (2013.01); *H05K 1/028* (2013.01); *H05K 1/0237* (2013.01); *H05K 1/0281* (2013.01); H01L 2924/0002 (2013.01); H05K 1/0225 (2013.01); H05K 1/147 (2013.01); H05K 2201/09727 (2013.01)

(58) Field of Classification Search
USPC .................................................... 333/246, 33
See application file for complete search history.

(56) References Cited

U.S. PATENT DOCUMENTS 7,605,679 B1 * 10/2009 Doane et al. ........... H01P 1/047
333/246
2012/0274423 A1 * 11/2012 Kato ................... H01P 1/20363
333/238

FOREIGN PATENT DOCUMENTS

| JP | 09-260905 A | 10/1997 |
| JP | 2000-091801 A | 3/2000 |
| JP | 2011-071403 A | 4/2011 |
| WO | 2012/073591 A1 | 6/2012 |

* cited by examiner

MULTI-LAYER RESIN SUBSTRATE HAVING GROUNDING CONDUCTORS CONFIGURED TO FORM TRIPLATE LINE SECTIONS AND MICROSTRIP SECTIONS

BACKGROUND OF THE INVENTION

1. Field of the Invention

The present invention relates to a resin multilayer substrate including a signal line and preferably for use in a bent state, and an electronic apparatus including the resin multilayer substrate.

2. Description of the Related Art

Examples of resin multilayer substrates made of thermoplastic resin include a flexible substrate on which components are densely mounted in an electronic apparatus or the like and a flat cable arranged so as to extend through small gaps or the like in an apparatus. Such a resin multilayer substrate may include a triplate line as a signal line for transmitting high-frequency signals. The triplate line is a signal line including a line conductor and grounding conductors disposed in the resin multilayer substrate such that both surfaces of the line conductor oppose the corresponding grounding conductors, which are wider than the line conductor (see, for example, Japanese Unexamined Patent Application Publication No. 2011-71403). Since the grounding conductors are provided at both sides of the triplate line, the triplate line is resistant to external noise, and unnecessary radiation (i.e., unnecessary emission) does not easily occur.

There has been an increasing demand for smaller and thinner electronic apparatuses, such as mobile devices, and spaces in such an apparatus are required to be utilized efficiently. In a mobile device, for example, the resin multilayer substrate may be bent so as to follow the shape of the space in the device. However, in the case where the resin multilayer substrate includes the triplate line, the two grounding conductors included in the triplate line overlap and cannot be easily deformed. Therefore, it is difficult to bend the resin multilayer substrate. When the resin multilayer substrate including the triplate line is forcibly bent, one of the two grounding conductors tries to expand and become longer than the other grounding conductor. Accordingly, the grounding conductors and the surrounding region receive excessive stress, and are excessively deformed. As a result, the transmission characteristics of the triplate line will be degraded due to breakage of the grounding conductors or deformation of the grounding conductors and the surrounding region.

SUMMARY OF THE INVENTION

Preferred embodiments of the present invention provide a resin multilayer substrate including a triplate line that is easily bent and with which the transmission characteristics are not easily degraded even when the resin multilayer substrate is bent, and provide an electronic apparatus including the resin multilayer substrate.

A resin multilayer substrate according to a preferred embodiment of the present invention includes a plurality of resin layers that are flexible and stacked on top of each other; a line conductor that is stacked on one of the resin layers; and a pair of grounding conductors, each of which is stacked on a different one of the resin layers at a position different from a position of the line conductor in a direction in which the resin layers are stacked. The resin multilayer substrate includes a triplate line in which both surfaces of the line conductor oppose the corresponding grounding conductors, and a microstrip line which is connected to the triplate line and in which only one of the surfaces of the line conductor opposes the corresponding grounding conductor. A width of the line conductor in the microstrip line is greater than a width of the line conductor in the triplate line. The resin multilayer substrate is bent at a position where the microstrip line is provided.

With this structure, since the resin multilayer substrate is bent at the position where the microstrip line is provided, the number of grounding conductors that oppose the line conductor is small and the resin multilayer substrate is easily bent. When the resin multilayer substrate is bent at the position where the microstrip line is provided, the corresponding grounding conductor and the surrounding region receive a small stress, and are deformed by a small amount. Although no grounding conductor is provided at one side of the line conductor in the microstrip line, since the width of the line conductor in the microstrip line is greater than the width of the line conductor in the triplate line, the capacitance between the line conductor and the grounding conductors is prevented from being excessively reduced in the microstrip line.

In the above-described resin multilayer substrate, the microstrip line may include a first microstrip line in which one of the grounding conductors included in the triplate line opposes the line conductor, and a second microstrip line in which the other one of the grounding conductors included in the triplate line opposes the line conductor.

In the above-described resin multilayer substrate, a thin portion may be provided at a position where the microstrip line is provided. When the thin portion, in which the thickness of the multilayer body is small, is provided, the resin multilayer substrate is able to be more easily bent, and expansion of the corresponding grounding conductor is further reduced.

In the above-described triplate line, preferably, one of the grounding conductors includes a plurality of openings arranged periodically along the line conductor, and the other one of the grounding conductors opposes the line conductor over the entire area of the line conductor. In addition, a width of the line conductor is periodically increased at positions where the line conductor opposes the openings, and a distance between the grounding conductor including the openings and the line conductor is smaller than a distance between the other grounding conductor and the line conductor. In this case, although the distance between the grounding conductor including the openings and the line conductor is decreased to reduce the thickness of the resin multilayer substrate, since the area in which the grounding conductor including the openings and the line conductor oppose each other is small, the characteristic impedance is prevented from being excessively reduced. In addition, since the width of the line conductor is increased at positions where the line conductor overlaps the openings, appropriate transmission characteristics are obtained.

An electronic apparatus according to a preferred embodiment of the present invention may include the above-described resin multilayer substrate and a circuit element arranged so as to oppose the resin multilayer substrate.

In the above-described electronic apparatus, the resin multilayer substrate may include a region in which one principal surface of the resin multilayer substrate is valley-folded (i.e., the resin multilayer substrate is folded such that the one principal surface includes a region defined by a valley shape, that is, a region located on an interior surface of the fold), the microstrip line being configured such that the corresponding grounding conductor is disposed near the one principal surface in the region. In addition, the circuit element may include a high-frequency circuit, and be disposed adjacent to the one principal surface of the resin multilayer substrate.

In the above-described electronic apparatus, the resin multilayer substrate may include a region in which one principal surface of the resin multilayer substrate is mountain-folded (i.e., the resin multilayer substrate is folded such that the one principal surface includes a region defined by a mountain shape, that is, a region located on an exterior surface of the fold), the microstrip line being configured such that the corresponding grounding conductor is disposed near the one principal surface in the region. In addition, the circuit element may include a metal body, and is disposed adjacent to the other principal surface of the resin multilayer substrate.

In the above-described electronic apparatus, the resin multilayer substrate may have a region in which one principal surface of the resin multilayer substrate is valley-folded and a region in which the one principal surface is mountain-folded, and the microstrip line may be configured such that the line conductor is disposed near a principal surface of the resin multilayer substrate at a side opposite to a side of the one principal surface in the region in which the one principal surface is mountain-folded and the region in which the one principal surface is valley-folded. In addition, a radius of curvature of the resin multilayer substrate may be greater in the region in which the one principal surface is valley-folded than in the region in which the one principal surface is mountain-folded.

According to various preferred embodiments of the present invention, the resin multilayer substrate is easily bent. In addition, when the resin multilayer substrate is bent, the risk that the transmission characteristics will be deteriorated due to the stress applied to the corresponding grounding conductor and the surrounding region and deformations thereof is significantly reduced. Furthermore, the risk that the transmission characteristics will be deteriorated due to impedance mismatching caused when the capacitance between the line conductor and the grounding conductors is reduced in the microstrip line is also significantly reduced. Thus, deterioration of the transmission characteristics of the resin multilayer substrate is significantly reduced or prevented, and the resin multilayer substrate is usable even when strict characteristic settings are required.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First, a resin multilayer substrate according to a first preferred embodiment of the present invention that defines and functions as a flat cable will be described.

Figure 1A:
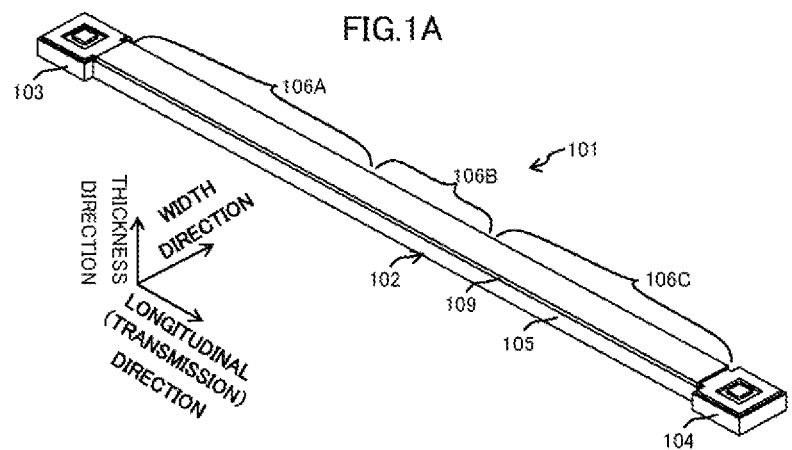
FIG. 1A is a perspective view of a resin multilayer substrate according to a first preferred embodiment of the present invention.

FIG. 1A is a perspective view of a flat cable 101 according to the first preferred embodiment of the present invention.

The flat cable 101 includes a multilayer body 102 and a resist portion 109. The multilayer body 102 is obtained preferably by stacking multiple thermoplastic resin layers (hereinafter referred to simply as resin layers) having a thickness of about 10 μm to about 100 μm, for example, in a thickness direction. The thermoplastic resin may be, for example, a flexible and thermoplastic material such as polyimide or liquid crystal polymer.

The multilayer body 102 includes terminal portions 103 and 104 and a line portion 105. The terminal portions 103 and 104 have the shape of a rectangular or substantially rectangular flat plate in a plan view when viewed in the thickness direction. The terminal portion 103 is connected to one end of the line portion 105 in the longitudinal direction. The terminal portion 104 is connected to the other end of the line portion 105 in the longitudinal direction. The line portion 105 has the shape of a belt that extends in a longitudinal or transmission direction such that the line portion 105 connects the terminal portions 103 and 104 in a plan view when viewed in the thickness direction. The width of the line portion 105 along a width direction is smaller than that of the terminal portions 103 and 104, and the thickness of the line portion 105 along a thickness direction is the same as that of the terminal portions 103 and 104. The resist portion 109 is made of an insulating resist material, and covers one of the principal surfaces of the line portion 105 in the thickness direction in a state such that the terminal portions 103 and 104 are exposed.

A triplate line 106A, a microstrip line 106B, and a triplate line 106C are provided in the line portion 105 and on a principal surface of the line portion 105. The triplate line 106A extends from the terminal portion 103 along the line portion 105. The triplate line 106C extends from the terminal portion 104 along the line portion 105. The microstrip line 106B connects the triplate lines 106A and 106C to each other. In addition to the triplate lines 106A and 106C and the microstrip line 106B, the line portion 105 may also include, for example, electrodes of inductors or capacitors (not shown). The line portion 105 may also include certain components mounted therein (not shown).

Figure 1B:
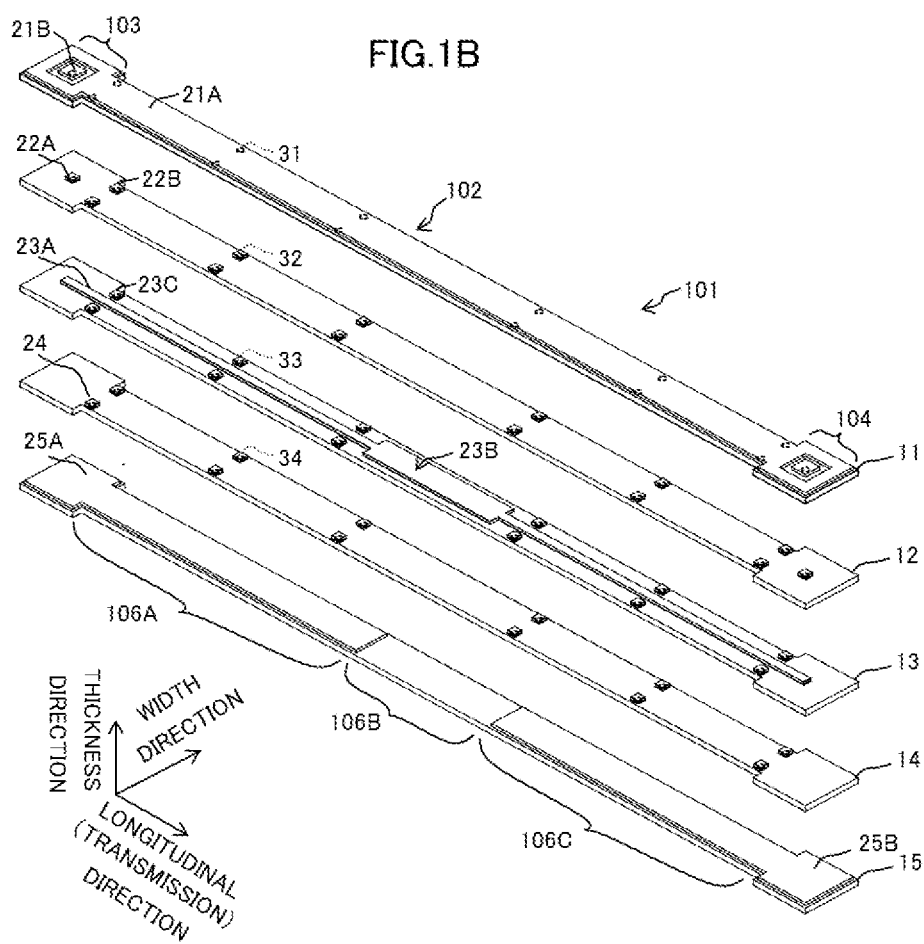
FIG. 1B is an exploded perspective view of the resin multilayer substrate according to the first preferred embodiment of the present invention.

FIG. 1B is an exploded perspective view of the flat cable 101. The resist portion 109 is not shown in FIG. 1B.

The multilayer body 102 includes resin layers 11, 12, 13, 14, and 15. The resin layers 11 to 15 are stacked in that order from one principal surface of the multilayer body 102. The resin layers 11 to 14 have via holes provided therein, and via-hole conductors 31, 32, 33, and 34 are arranged in the respective via holes.

Each of the resin layers 11 to 15 includes a circuit pattern on one principal surface thereof. Each circuit pattern includes a copper material or the like that preferably has a thickness in a thickness direction of about 10 µm to about 20 µm, for example, and that is highly conductive and ductile. Copper foil, for example, may be used as the copper material.

More specifically, grounding conductors 25A and 25B are provided on one principal surface of the resin layer 15. The grounding conductor 25A is provided on the resin layer 15 over substantially the entire areas of the triplate line 106A and the terminal portion 103. The grounding conductor 25B is provided on the resin layer 15 over substantially the entire areas of the triplate line 106C and the terminal portion 104. The grounding conductors 25A and 25B are not provided on the resin layer 15 in the microstrip line 106B.

Pad conductors 24 are provided on one principal surface of the resin layer 14. Two lines of pad conductors 24, each line including three pad conductors 24, are provided on the resin layer 14 for each of the triplate lines 106A and 106C. The pad conductors 24 cover the respective via-hole conductors 34, and are electrically connected to the grounding conductor 25A or the grounding conductor 25B on the resin layer 15 through the via-hole conductors 34. The number of pad conductors 24 and the number of via-hole conductors 34 are not limited, and the pad conductors 24 may be omitted.

A line conductor 23A and pad conductors 23C are provided on one principal surface of the resin layer 13. The line conductor 23A is belt-shaped, and extends along a longitudinal or transmission direction of the resin layer 13 from the terminal portion 103 to the terminal portion 104 through the line portion 105. The line conductor 23A includes a wide portion 23B provided on the resin layer 13 in the microstrip line 106B. The wide portion 23B is a portion of the line conductor 23A that is wider than other portions in the width direction of the flat cable 101.

Three pad conductors 23C are provided on the resin layer 13 at each side of the line conductor 23A for each of the triplate lines 106A and 106C. The pad conductors 23C cover the respective via-hole conductors 33, and are electrically connected to the pad conductors 24 on the resin layer 14 through the via-hole conductors 33. The number of pad conductors 23C and the number of via-hole conductors 33 are not limited, and the pad conductors 23C may be omitted.

Pad conductors 22A and 22B are provided on one principal surface of the resin layer 12. One pad conductor 22A is provided on the resin layer 12 for each of the terminal portions 103 and 104. The pad conductors 22A cover the respective via-hole conductors 32, and are electrically connected to the line conductor 23A on the resin layer 13 through the via-hole conductors 32.

Two lines of pad conductors 22B, each line including three pad conductors 22B, are provided on the resin layer 12 for each of the triplate lines 106A and 106C. The pad conductors 22B cover the respective via-hole conductors 32, and are electrically connected to the pad conductors 23C on the resin layer 13 through the via-hole conductors 32. The number of pad conductors 22B and the number of via-hole conductors 32 are not limited, and the pad conductors 22B may be omitted.

A grounding conductor 21A and land conductors 21B are provided on one principal surface of the resin layer 11. The grounding conductor 21A is provided on the resin layer 11 over substantially the entire areas of the triplate lines 106A and 106C and the microstrip line 106B. In addition, the grounding conductor 21A is arranged so as to surround the land conductors 21B with gaps therebetween in the terminal portions 103 and 104. The grounding conductor 21A is electrically connected to the pad conductors 22B on the resin layer 12 through the via-hole conductors 31.

One land conductor 21B is provided on the resin layer for each of the terminal portions 103 and 104. The land conductors 21B cover the respective via-hole conductors 31, and are electrically connected to the pad conductors 22A on the resin layer 12 through the via-hole conductors 31.

In the terminal portions 103 and 104 of the multilayer body 102 in which the above-described resin layers 11 to 15 are stacked together, the grounding conductor 21A and the land conductors 21B are not covered by the resist portion 109 (FIG. 1A), and are exposed. These conductors are used as external connection terminals. The land conductor 21B exposed at the terminal portion 103 and the land conductor 21B exposed at the terminal portion 104 are connected to each other through the pad conductors 22A and the line conductor 23A. The grounding conductor 21A exposed at the terminal portions 103 and 104 is connected to the grounding conductors 25A and 25B through the pad conductors 22B, the pad conductors 23C, and the pad conductors 24. Connectors that are electrically connected to the grounding conductor 21A and the land conductors 21B may be mounted on the multilayer body 102 in the terminal portions 103 and 104.

Figure 2:
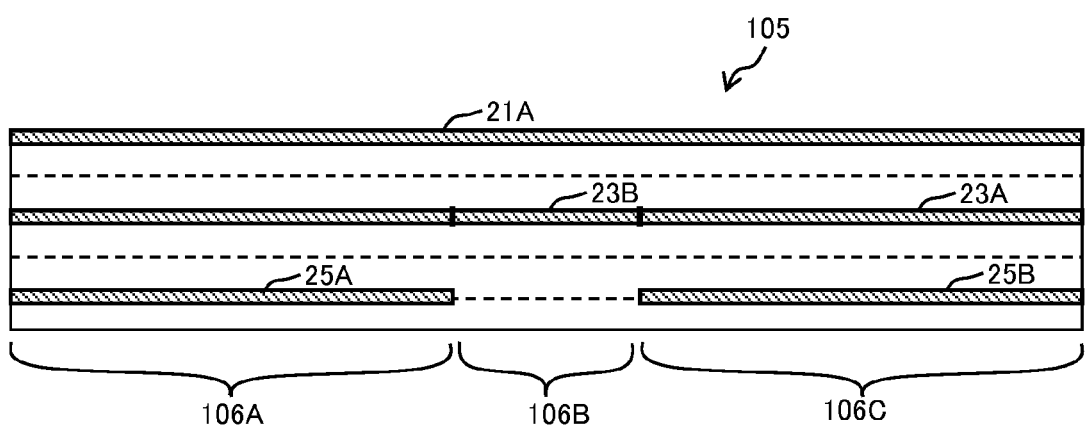
FIG. 2 is a sectional view of a main portion of the resin multilayer substrate according to the first preferred embodiment of the present invention.

FIG. 2 is a schematic sectional view of the line portion 105.

In the line portion 105, the triplate line 106A is structured such that both surfaces of the line conductor 23A oppose the corresponding grounding conductors 21A and 25A, and the triplate line 106C is structured such that both surfaces of the line conductor 23A oppose the corresponding grounding conductors 21A and 25B. The distance between the line conductor 23A and the grounding conductor 21A is equal or substantially equal to the distance between the line conductor 23A and the grounding conductor 25B. Since the triplate lines 106A and 106C have the grounding conductor 21A and the grounding conductors 25A and 25B at both sides thereof, the triplate lines 106A and 106C are resistant to external noise, and unnecessary radiation (i.e., unnecessary emission) does not easily occur.

The microstrip line 106B is structured such that only one of the surfaces of the line conductor 23A opposes the grounding conductor 21A. In the microstrip line 106B, one surface of the line conductor 23A does not oppose either of the grounding conductors 25A and 25B. Therefore, a capacitance is generated only between the line conductor 23A and the grounding conductor 21A. Accordingly, if this capacitance differs from the capacitance in the triplate lines 106A and 106C by a large amount, the characteristic impedance of the microstrip line 106B differs from that of the triplate lines 106A and 106C (for example, about 50Ω) by a large amount. As a result, impedance mismatching occurs in the line portion 105, and reflection and loss are increased, which leads to degradation of transmission characteristics. Therefore, in the microstrip line 106B, the line conductor 23A includes the wide portion 23B so that the line width is greater than that of the triplate lines 106A and 106C. Thus, the characteristic impedance is prevented from being changed by a large amount due to a large reduction in the capacitance between the line conductor 23A and the grounding conductors in the microstrip line 106B, and degradation in the transmission characteristics of the line portion 105 is significantly reduced or prevented.

An example of a structure in which the flat cable 101 is disposed in an electronic apparatus will now be described.

Figure 3A:
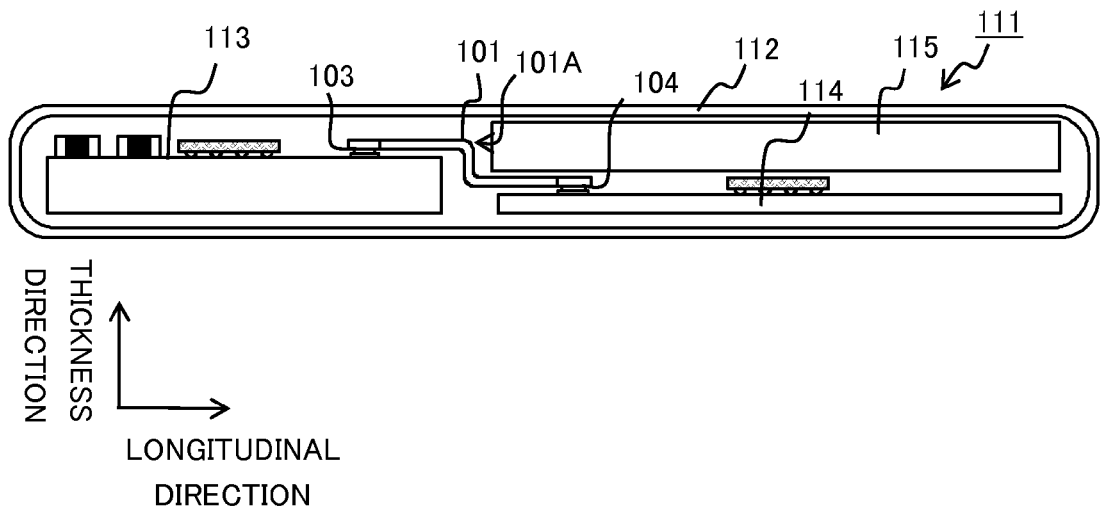
FIG. 3A is a sectional side view of an electronic apparatus according to the first preferred embodiment of the present invention.
Figure 3B:
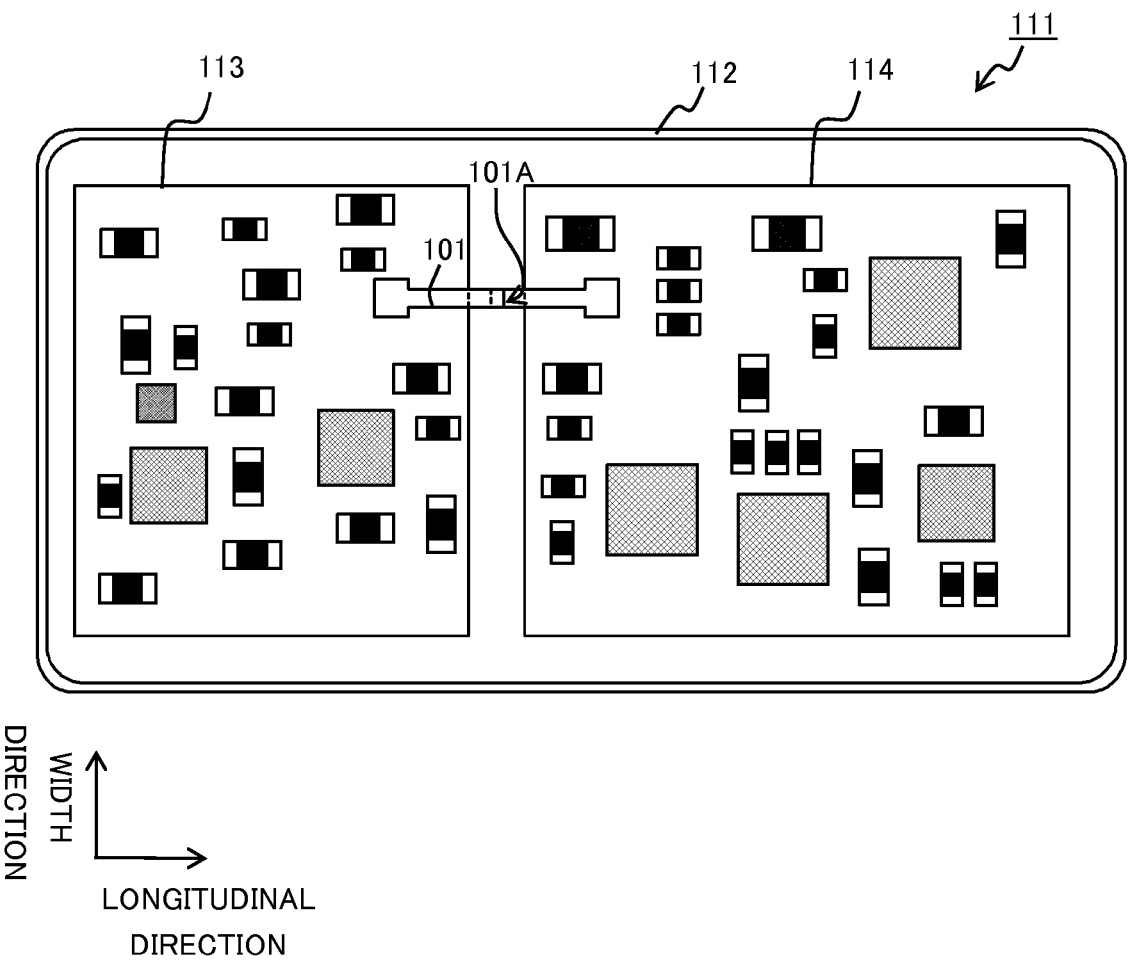
FIG. 3B is a sectional plan view of the electronic apparatus according to the first preferred embodiment of the present invention.

FIG. 3A is a sectional side view of an electronic apparatus 111 in which the flat cable 101 is disposed. FIG. 3B is a sectional plan view of the electronic apparatus 111. The electronic apparatus 111 includes the flat cable 101, a housing 112, circuit boards 113 and 114, which are other circuit elements, and a battery module 115 (FIG. 3A), which is another circuit element. The electronic apparatus 111 is, for example, a mobile phone or a tablet device. The flat cable 101, the circuit boards 113 and 114, and the battery module 115 are disposed in the housing 112. The circuit boards 113 and 114 are arranged in the housing 112 such that principal surfaces thereof extend in the width and longitudinal directions (FIG. 3B) and are at different heights in the thickness direction (FIG. 3A). The battery module 115 is arranged so as to oppose a principal surface of the circuit board 114.

The flat cable 101 is connected to the circuit board 113 by a bonding material, such as solder, at the terminal portion 103 (FIG. 3A). The flat cable 101 is connected to the circuit board 114 by a bonding material, such as solder, at the terminal portion 104 (FIG. 3A). Thus, the circuit boards 113 and 114 are electrically connected to each other by the flat cable 101.

The flat cable 101 is flexible, and may be used in a bent state. The flat cable 101 includes a bent portion 101A at a position near the center of the flat cable 101 in the longitudinal direction (FIGS. 3A and 3B). When the bent portion 101A is provided, the flat cable 101 is easily installed even when the principal surfaces of the circuit boards 113 and 114 are at different heights. Since the thickness of the flat cable 101 is small, the flat cable 101 is easily installed even when the gaps between the circuit board 113 and the housing 112 and between the circuit board 114 and the battery module 115 are so small that coaxial cables cannot be installed therein.

Non-limiting examples of mounting modes of the flat cable 101 in the electronic apparatus will now be described.

Figure 4A:
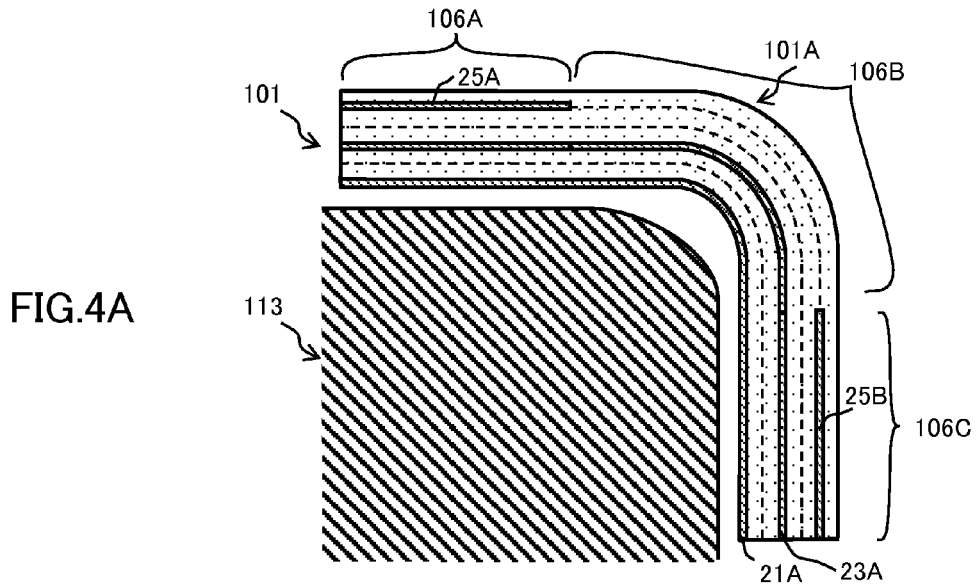
FIGS. 4A, 4B, and 4C are sectional views of main portions of the resin multilayer substrate, illustrating mounting modes of the resin multilayer substrate according to the first preferred embodiment of the present invention.

FIG. 4A is an enlarged sectional view illustrating a first mounting mode of the flat cable 101.

In the flat cable 101 in this mode, the triplate line 106A and the triplate line 106C are maintained flat, and the microstrip line 106B is bent to provide the bent portion 101A. The bent portion 101A is formed preferably by bending the microstrip line 106B such that the principal surface on which the grounding conductor 21A is provided is valley-folded. The above-described circuit board 113 is disposed adjacent to the principal surface of the flat cable 101 on which the grounding conductor 21A is provided.

In the microstrip line 106B, only the grounding conductor 21A opposes the line conductor 23A, and neither of the grounding conductors 25A and 25B opposes the line conductor 23A. Thus, the number of conductors that oppose each other is small in the microstrip line 106B, and the flat cable 101 is easily bent at the microstrip line 106B.

In this mounting mode, in the bent portion 101A of the microstrip line 106B, the line conductor 23A receives a tensile stress and the grounding conductor 21A receives a compressive stress. These stresses increase as the gap between the opposing conductors increases. Since the grounding conductors 25A and 25B are not disposed at the outer side of the bent portion of the flat cable 101, the stress applied to the grounding conductor 21A is smaller than that in the case where the flat cable 101 is bent at the triplate line 106A or 106C. Therefore, deformations of the grounding conductor 21A and the resin layers around the grounding conductor 21A are small, and the risk that the transmission characteristics will vary due to the deformations is reduced.

In addition, in this mounting mode, the circuit board 113 opposes the grounding conductor 21A. Therefore, the electromagnetic waves emitted from the circuit board 113 are blocked by the grounding conductor 21A, and the risk that the electromagnetic waves will serve as noise for the flat cable 101 and that the transmission characteristics will be degraded is significantly reduced. Although unnecessary radiation (i.e., unnecessary emission) from the microstrip line 106B occurs, since the circuit board 113 opposes the microstrip line 106B with the grounding conductor 21A disposed therebetween, the circuit board 113 is not easily influenced by the unnecessary radiation (i.e., unnecessary emission) from the microstrip line 106B. Therefore, when the flat cable 101 is mounted in the electronic apparatus 111 in the above-described mounting mode, high-frequency characteristics of the overall apparatus are improved.

Figure 4B:
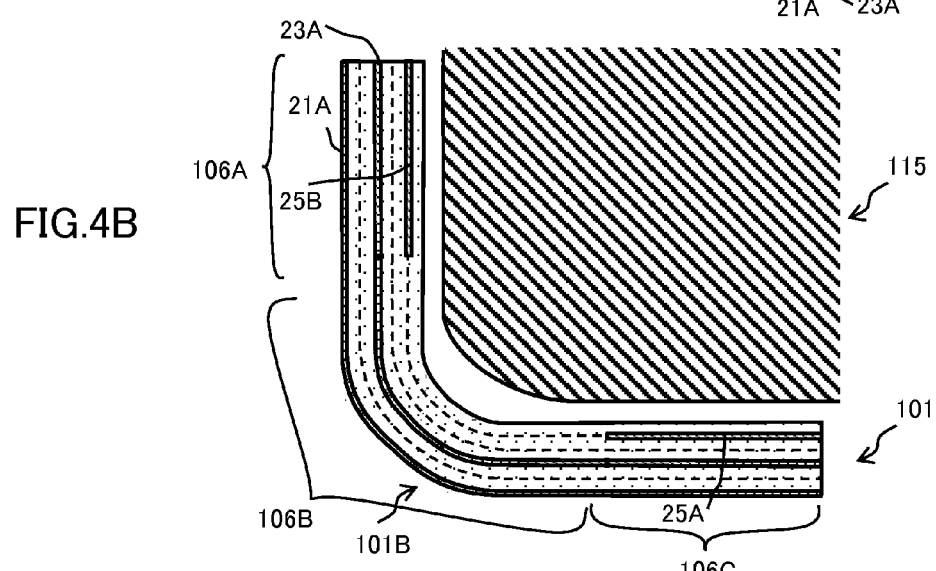

FIG. 4B is an enlarged sectional view illustrating a second mounting mode of the flat cable 101.

In the flat cable 101 in this mode, the triplate line 106A and the triplate line 106C are maintained flat, and the microstrip line 106B is bent to provide a bent portion 101B. The bent portion 101B is formed preferably by bending the microstrip line 106B such that the principal surface on which the grounding conductor 21A is provided is mountain-folded. The above-described battery module 115 is disposed adjacent to a principal surface of the flat cable 101 at a side opposite to the side of the principal surface on which the grounding conductor 21A is provided. The flat cable 101 is also easily bent such that the bent portion 101B is provided.

In this mounting mode, in the bent portion 101B of the microstrip line 106B, the line conductor 23A receives a compressive stress and the grounding conductor 21A receives a tensile stress. Also in this case, the stress applied to the grounding conductor 21A is smaller than that in the case where the flat cable 101 is bent at the triplate line 106A or 106C. Therefore, the risk that the transmission characteristics will vary due to deformations of the grounding conductor 21A and the resin layers around the grounding conductor 21A is reduced. If the line conductor 23A, which has a small line width, receives a tensile stress, there is a risk that the line conductor 23A will break. However, in this mounting mode, the line conductor 23A does not easily receive a tensile stress, and therefore breakage of the line conductor 23A does not easily occur.

In addition, in this mounting mode, the battery module 115 opposes the line conductor 23A through the gap between the grounding conductors 25A and 25B in the microstrip line 106B. In general, the battery module 115 includes a casing including a metal body that defines and functions as a grounding conductor. Therefore, unnecessary radiation (i.e., unnecessary emission) from the battery module 115 and electromagnetic waves from the outside are blocked. Accordingly, also in this mounting mode, noise and unnecessary radiation are blocked, and high-frequency characteristics of the overall electronic apparatus 111 (FIGS. 3A and 3B) are improved.

Figure 4C:
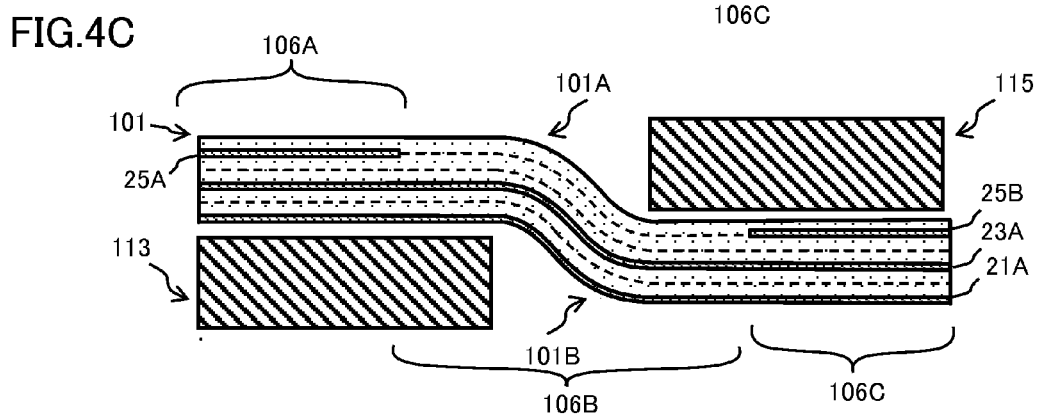

FIG. 4C is an enlarged sectional view illustrating a third mounting mode of the flat cable 101.

In the flat cable 101 in this mode, the triplate line 106A and the triplate line 106C, including the grounding conductors 25A and 25B, are maintained flat, and the microstrip line 106B is bent in opposite directions to provide the bent portions 101A and 101B. The bent portion 101A is formed preferably by bending the microstrip line 106B such that the principal surface on which the grounding conductor 21A is provided is valley-folded. The bent portion 101B is formed preferably by bending the microstrip line 106B such that the principal surface on which the grounding conductor 21A is provided is mountain-folded. In the bent portion 101A, the above-described circuit board 113 is disposed adjacent to the principal surface of the flat cable 101 on which the grounding conductor 21A is provided. In the bent portion 101B, the above-described battery module 115 is disposed adjacent to the other principal surface of the flat cable 101. Thus, the flat cable 101 may be bent such that the bent portions 101A and 101B are continuously formed.

In the flat cable 101 in this mounting mode, the triplate lines 106A and 106C are maintained flat, and the bent portions 101A and 101B are located in the microstrip line 106B. Thus, the microstrip line 106B may be easily formed so as to include a plurality of bent portions 101A and 101B. Also in this mode, the risk that the transmission characteristics will be degraded due to deformations of the grounding conductor 21A and the resin layers around the grounding conductor 21A is significantly reduced. The battery module 115, with which the risk of mutual interference with the microstrip line 106B is relatively small, is arranged so as to oppose the principal surface of the flat cable 101 at which the line conductor 23A is provided, and the circuit board 113, with which the risk of mutual interference with the microstrip line 106B is relatively large, is arranged so as to oppose the principal surface of the flat cable 101 at the other side. Therefore, noise and unnecessary radiation are blocked, and the high-frequency characteristics of the overall electronic apparatus 111 (FIGS. 3A and 3B) are improved.

As is clear from the above-described description of the first to third mounting modes, the flat cable 101 according to the present preferred embodiment may be bent in various modes in the electronic apparatus. In any mode, the flat cable 101 is easily bent at the microstrip line 106B disposed between the triplate lines 106A and 106C. When the flat cable 101 is bent at the microstrip line 106B, the grounding conductors and the line conductor do not receive excessive stress, and excessive deformation thereof does not occur. Accordingly, high reliability and stable transmission characteristics are realized. In addition, since the width of the line conductor is increased in the microstrip line 106B, the characteristic impedance of the microstrip line 106B does not differ from that of the triplate lines 106A and 106C by a large amount, and satisfactory transmission characteristics are realized.

Next, a resin multilayer substrate according to a second preferred embodiment of the present invention that defines and functions as a flat cable will be described.

Figure 5A:
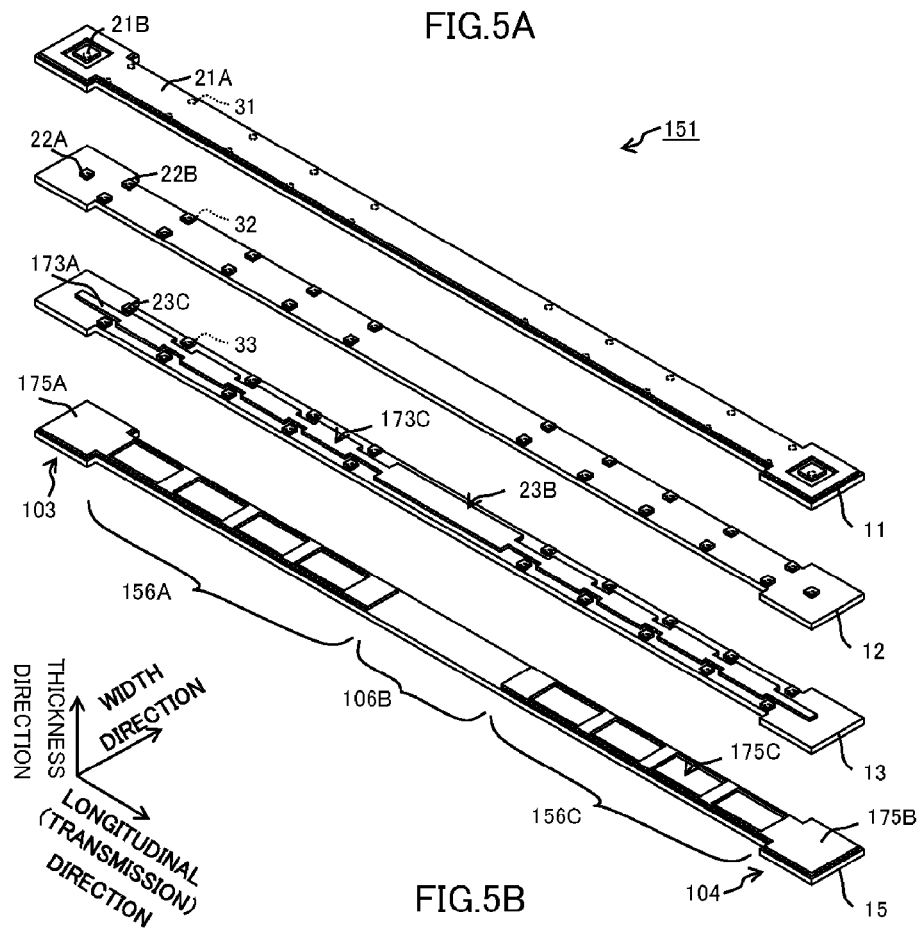
FIG. 5A is an exploded perspective view of a resin multilayer substrate according to a second preferred embodiment of the present invention.

FIG. 5A is an exploded perspective view of a flat cable 151 according to the second preferred embodiment of the present invention. In the following description, components similar to those in the first preferred embodiment are denoted by the same reference numerals and description thereof may be omitted.

The flat cable 151 includes resin layers 11, 12, 13, and 15, and the number of resin layers included in the flat cable 151 is smaller by one than that in the first preferred embodiment. A triplate line 156A, a microstrip line 106B, and a triplate line 156C are provided in the flat cable 151 and on a principal surface of the flat cable 151.

A grounding conductor 21A and land conductors 21B similar to those in the first preferred embodiment are provided on a principal surface of the resin layer 11. Pad conductors 22A and 22B similar to those in the first preferred embodiment are provided on a principal surface of the resin layer 12. A line conductor 173A having a shape different from that in the first preferred embodiment and pad conductors 23C similar to those in the first preferred embodiment are provided on a principal surface of the resin layer 13. Grounding conductors 175A and 175B having shapes different from those in the first preferred embodiment are provided on a principal surface of the resin layer 15.

The grounding conductor 175A is provided on the resin layer 15 in the triplate line 156A. The grounding conductor 175B is provided on the resin layer 15 in the triplate line 156C. The grounding conductors 175A and 175B include a plurality of openings 175C that are arranged in a direction of transmission of high-frequency signals. Thus, the grounding conductors 175A and 175B are ladder-shaped in a plan view.

The grounding conductor 21A, which has no openings, defines and functions as a reference grounding conductor that determines a main portion of the characteristic impedance of the flat cable 151. The grounding conductors 175A and 175B including the openings 175C define and function as auxiliary grounding conductors that finely adjust the characteristic impedance of the flat cable 151 to a predetermined characteristic impedance (for example, about 50Ω).

The line conductor 173A provided on the resin layer 13 includes not only a wide portion 23B in the microstrip line 106B but also wide portions 173C in the triplate lines 156A and 156C. The wide portions 173C are portions of the line conductor 173A that are narrower than the wide portion 23B and wider than other portions in the width direction of the flat cable 151.

In the flat cable 151, the number of resin layers is smaller than that in the first preferred embodiment by one, and the overall structure of the flat cable 151 is thin. More specifically, a resin layer is omitted between the line conductor 173A and the grounding conductors 175A and 175B. Therefore, the gap between the line conductor 173A and the grounding conductors 175A and 175B is smaller than the gap between the line conductor 173A and the grounding conductor 21A. Accordingly, the capacitance between the line conductor 173A and the grounding conductors 175A and 175B per unit area is greater than the capacitance between the line conductor 173A and the grounding conductor 21A per unit area.

Therefore, the openings 175C are provided in the grounding conductors 175A and 175B, and the line conductor 173A includes the wide portions 173C. Accordingly, the capacitance between the line conductor 173A and the grounding conductors 175A and 175B is prevented from being greater than the capacitance between the line conductor 173A and the grounding conductor 21A.

Since the overall structure of the flat cable 151 is thin, the flat cable 151 is more easily bent at the microstrip line 106B compared to the first preferred embodiment. In addition, when the flat cable 151 is bent at the microstrip line 106B, the stress applied to portions near the grounding conductors and deformations of the portions are further reduced compared to those in the first preferred embodiment. In addition, since the line conductor includes wide portions as appropriate, the characteristic impedance is prevented from being varied by a large amount, and satisfactory transmission characteristics are realized.

An example of a mounting mode of the flat cable 151 in an electronic apparatus will now be described.

Figure 5B:
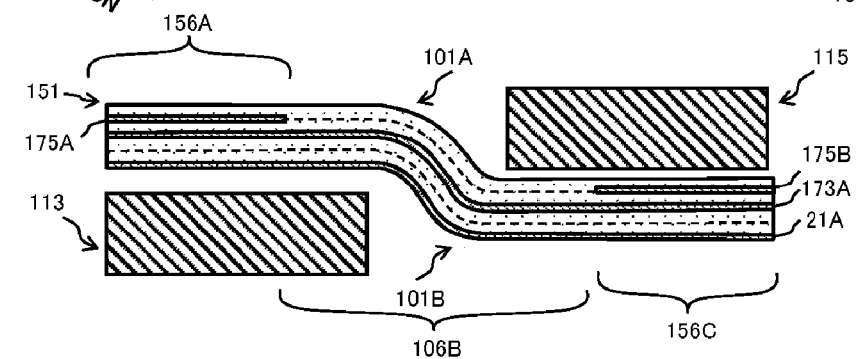
FIG. 5B is a sectional view of a main portion of the resin multilayer substrate, illustrating a mounting mode of the resin multilayer substrate according to the second preferred embodiment of the present invention.

FIG. 5B is an enlarged sectional view illustrating the mounting mode of the flat cable 151.

In the flat cable 151 in this mode, the triplate line 156A and the triplate line 156C, including grounding conductors 175A and 175B, are maintained flat, and the microstrip line 106B is bent in opposite directions to provide bent portions 101A and 101B. The bent portion 101A is formed preferably by bending the microstrip line 106B such that the principal surface on which the grounding conductor 21A is provided is valley-folded. The bent portion 101B is formed preferably by bending the microstrip line 106B such that the principal surface on which the grounding conductor 21A is provided is mountain-folded. In the bent portion 101A, the above-described circuit board 113 is disposed adjacent to the principal surface of the flat cable 151 on which the grounding conductor 21A is provided. In the bent portion 101B, the above-described battery module 115 is disposed adjacent to the other principal surface of the flat cable 151.

In this mounting mode, in the bent portion 101B, the line conductor 173A tends to receive a compressive stress, and the grounding conductor 21A tends to receive a tensile stress. In the bent portion 101A, the line conductor 173A tends to receive a tensile stress, and the grounding conductor 21A tends to receive a compressive stress. Therefore, the risk of breakage of the line conductor 173A is higher in the bent portion 101A, in which the line conductor 173A receives a tensile stress, than in the bent portion 101B. Accordingly, the radius of curvature of the bent portion 101A is set so as to be greater than that of the bent portion 101B. When the radius of curvature is increased, the amount of deformation is reduced and the stress applied to the line conductor 173A is reduced accordingly. Therefore, the risk of breakage of the line conductor 173A is significantly reduced by making the radius of curvature of the bent portion 101A greater than that of the bent portion 101B.

Next, a resin multilayer substrate according to a third preferred embodiment of the present invention that defines and functions as a flat cable will be described.

Figure 6A:
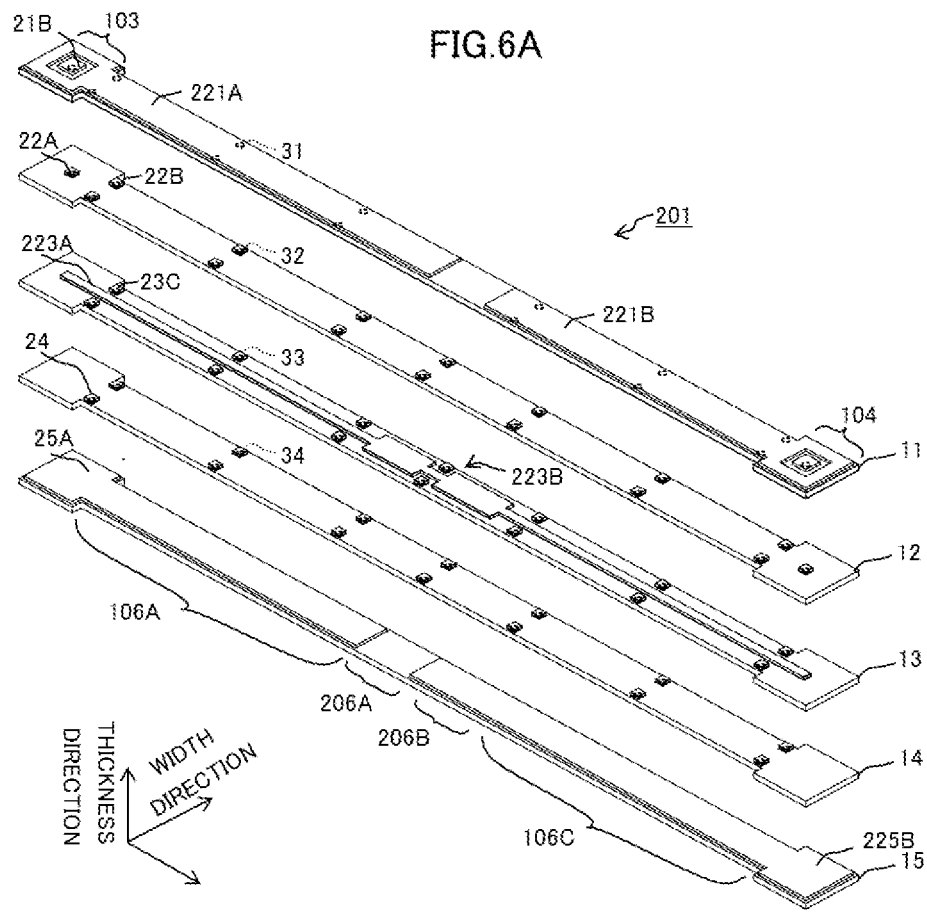
FIG. 6A is an exploded perspective view of a resin multilayer substrate according to a third preferred embodiment of the present invention.
Figure 6B:
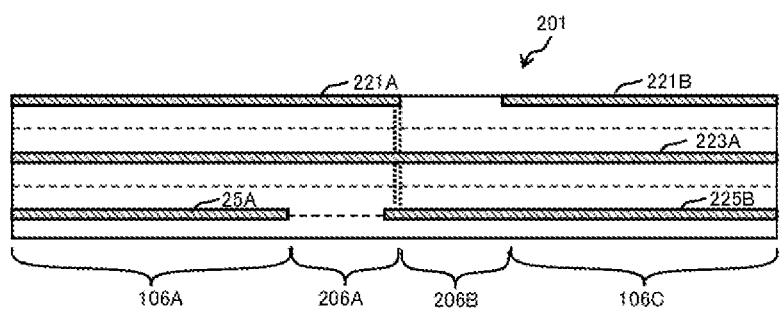
FIG. 6B is a sectional view of a main portion of the resin multilayer substrate according to the third preferred embodiment of the present invention.

FIG. 6A is an exploded perspective view of a flat cable 201 according to the third preferred embodiment of the present invention, and FIG. 6B is a sectional view of a main portion of the resin multilayer substrate according to the third preferred embodiment. In the following description, components similar to those in the first preferred embodiment are denoted by the same reference numerals and description thereof may be omitted.

The flat cable 201 includes microstrip lines 206A and 206B disposed between a triplate line 106A and a triplate line 106C.

Grounding conductors 221A and 221B having shapes different from that in the first preferred embodiment and land conductors 21B similar to those in the first preferred embodiment are provided on a principal surface of a resin layer 11. Pad conductors 22A and 22B similar to those in the first preferred embodiment are provided on a principal surface of a resin layer 12. A line conductor 223A having a shape different from that in the first preferred embodiment and pad conductors 23C similar to those in the first preferred embodiment are provided on a principal surface of a resin layer 13. Pad conductors 24 similar to those in the first preferred embodiment are provided on a principal surface of a resin layer 14. A grounding conductor 25A similar to that in the first preferred embodiment and a grounding conductor 225B having a shape different from that in the first preferred embodiment are provided on a principal surface of a resin layer 15.

The grounding conductor 225B provided on the resin layer 15 is longer than the grounding conductor 25B according to the first preferred embodiment in the longitudinal direction thereof, and extends to the boundary between the microstrip line 206B and the microstrip line 206A. The grounding conductors 221A and 221B provided on the resin layer 11 are separated from each other at the boundary between the microstrip line 206B and the microstrip line 206A. The grounding conductor 221A extends from a terminal portion 103 to the boundary between the microstrip line 206B and the microstrip line 206A. The grounding conductor 221B extends from a terminal portion 104 to the boundary between the triplate line 106C and the microstrip line 206B. The grounding conductor 225B and the grounding conductor 221A are connected to each other through via-hole conductors at the boundary between the microstrip line 206B and the microstrip line 206A. The line conductor 223A includes a wide portion 223B having a narrow region at the boundary between the microstrip line 206B and the microstrip line 206A, and the via-hole conductors and pad electrodes are provided on both sides of the narrowed region.

In this flat cable 201, the grounding conductor that opposes the line conductor 223A in the microstrip line 206A differs from the grounding conductor that opposes the line conductor 223A in the microstrip line 206B. Therefore, in the case where the flat cable 201 is bent in opposite directions, surfaces with high shielding performance may be arranged at the mountain-folded sides of the two bent portions or at the valley-folded sides of the two bent portions. Thus, by appropriately selecting the surface on which the grounding conductor is disposed in each microstrip line, the flat cable may be mounted in the electronic apparatus such that appropriate shielding performance is selected for each bent portion.

Next, a resin multilayer substrate according to a fourth preferred embodiment of the present invention that defines and functions as a flat cable will be described.

Figure 7:
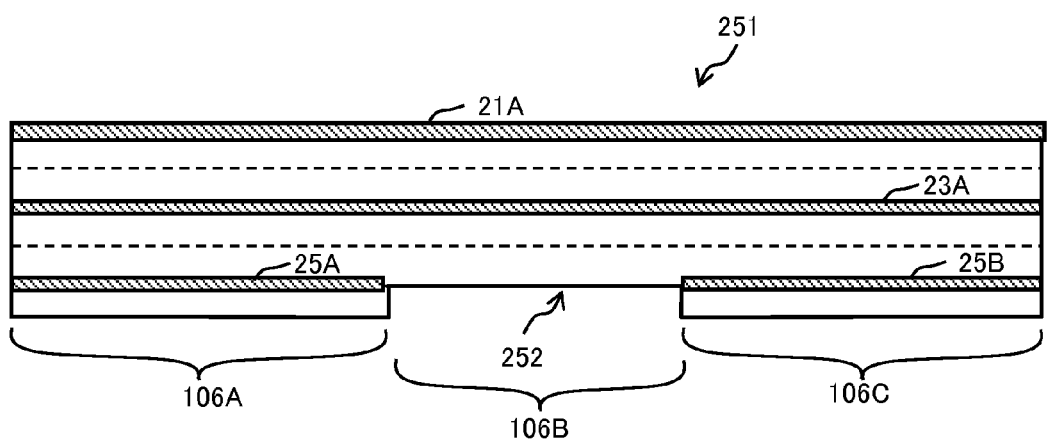
FIG. 7 is a sectional view of a main portion of a resin multilayer substrate according to a fourth preferred embodiment of the present invention.

FIG. 7 is a sectional view of a main portion of a flat cable 251 according to the fourth preferred embodiment of the present invention. In the following description, components similar to those in the first preferred embodiment are denoted by the same reference numerals and description thereof may be omitted.

The flat cable 251 includes a triplate line 106A, a triplate line 106C, and a thin portion 252 in a microstrip line 106B at a side opposite to the side at which a grounding conductor 21A is provided. The thickness of the multilayer body is reduced at the thin portion 252. In the case where the thin portion 252 is provided, the flat cable 251 is more easily bent at the microstrip line 106B. In addition, the tensile or compressive stress applied to the grounding conductor 21A is significantly reduced. Therefore, the transmission characteristics are further improved.

A resin multilayer substrate according to the present invention may be configured and structured as in each of the above-described preferred embodiments, for example. Although the resin multilayer substrates according to the above-described preferred embodiments define and function as flat cables, a resin multilayer substrate according to the present invention may define and function as a flexible substrate.

Figure 8:
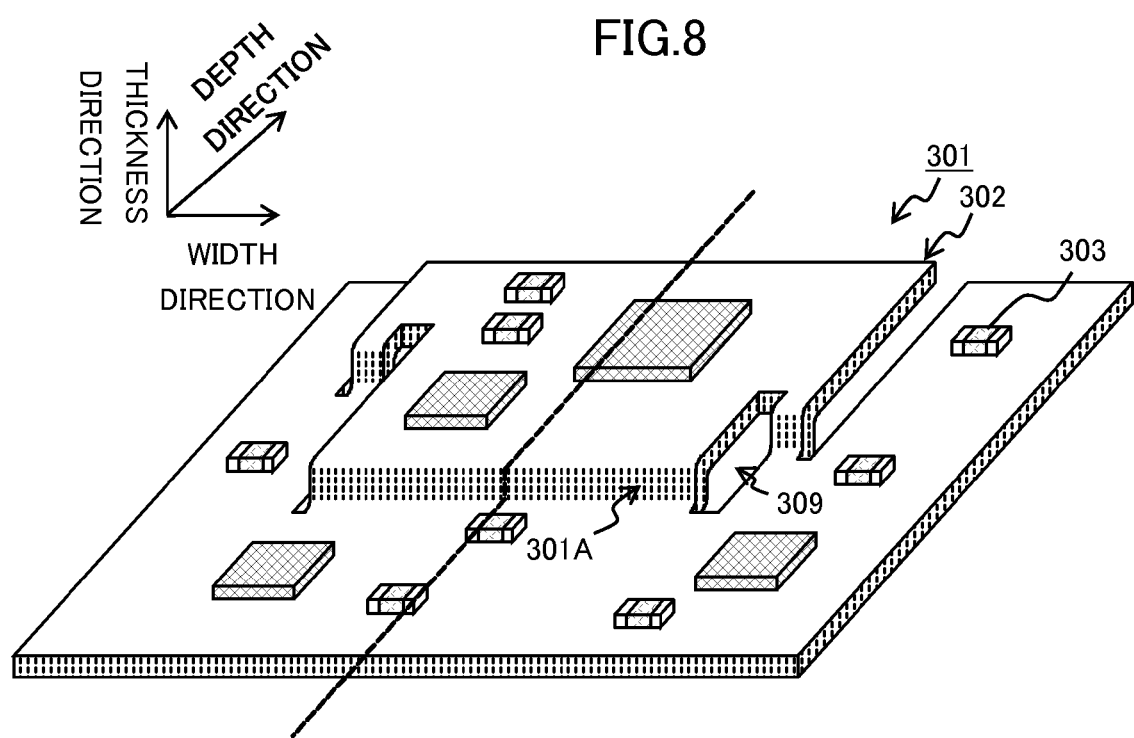
FIG. 8 is a perspective view of a resin multilayer substrate having another structure.

FIG. 8 is a perspective view illustrating an example of a resin multilayer substrate that defines and functions as a flexible substrate.

A flexible substrate 301 serves as a so-called sub-substrate used to achieve high-density mounting of multiple components and efficient space utilization in an apparatus. Accordingly, the flexible substrate 301 includes a multilayer body 302 and surface mount devices 303. The multilayer body 302 may have components mounted therein. The multilayer body 302 is formed preferably by stacking multiple resin layers having a thickness of about 10 μm to about 100 μm, for example, and forming a resist film on a surface thereof as appropriate. The surface mount devices 303 are mounted on a principal surface that extends in the depth and width directions of the multilayer body 302.

A bent portion 301A is formed on the multilayer body 302 in advance by, for example, hot pressing. Accordingly, the multilayer body 302 includes a plurality of openings 309. The openings 309 extend in the depth direction of the multilayer body 302 from an end of the bent portion 301A. The bent portion 301A is bent from a flat portion and extends in the thickness direction of the multilayer body 302.

The flexible substrate 301 may be configured and structured such that a triplate line and a microstrip line are provided therein and only the microstrip line passes through the bent portion 301A. In such a case, the flexible substrate 301 is easily bent, and degradation of transmission characteristics is significantly reduced or prevented.

Also in the above-described flat cables, the bent portions may be formed in advance by hot pressing or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a plurality of resin layers that are flexible and stacked on top of each other;
   a line conductor stacked on one of the plurality of resin layers; and
   a pair of grounding conductors, each of which is stacked on a different one of the plurality of resin layers at a position different from a position of the line conductor in a direction in which the plurality of resin layers are stacked; wherein
   the resin multilayer substrate includes a triplate line in which both surfaces of the line conductor oppose the corresponding pair of grounding conductors, and a microstrip line which is connected to the triplate line and in which only one of the surfaces of the line conductor opposes the corresponding grounding conductor;
   a width of the line conductor in the microstrip line is greater than a width of the line conductor in the triplate line;
   the resin multilayer substrate is bent at a position where the microstrip line is provided; and
   in the triplate line, a length of the pair of grounding conductors in an extending direction of the line conductor is greater than a length of at least one of the pair of grounding conductors in a width direction of the line conductor.

2. The resin multilayer substrate according to claim 1, wherein:
   the pair of grounding conductors included in the triplate line include a first grounding conductor and a second grounding conductor; and
   the microstrip line includes:
      a first microstrip line in which the first grounding conductor opposes the line conductor; and
      a second microstrip line in which the second grounding conductor opposes the line conductor.

3. The resin multilayer substrate according to claim 1, wherein a reduced thickness portion is provided at a position where the microstrip line is provided.

4. The resin multilayer substrate according to claim 1, wherein:
   the pair of grounding conductors include a first grounding conductor and a second grounding conductor; and
   in the triplate,
      the first grounding conductor includes a plurality of openings arranged along the line conductor;
      the second grounding conductor opposes the line conductor over an entire area of the line conductor;
      a width of the line conductor is increased at positions where the line conductor opposes corresponding ones of the plurality of openings; and
      a distance between the first grounding conductor and the line conductor is smaller than a distance between the second grounding conductor and the line conductor.

5. The resin multilayer substrate according to claim 1, wherein the plurality of resin layers include via holes and via-hole conductors provided in the via holes.

6. The resin multilayer substrate according to claim 5, wherein pad conductors are provided on the plurality of resin layers to cover the via holes.

7. The resin multilayer substrate according to claim 1, wherein one of the pair of grounding conductors extends over an entire area or substantially an entire area of the triplate line.

8. The resin multilayer substrate according to claim 1, wherein one of the pair of grounding conductors extends over an entire area or substantially an entire area of the triplate line and the microstrip line.

9. An electronic apparatus comprising:
   the resin multilayer substrate according to claim 1; and
   a circuit element arranged so as to oppose the resin multilayer substrate.

10. The electronic apparatus according to claim 9, wherein
    the resin multilayer substrate includes a region in which one principal surface of the resin multilayer substrate is valley-folded;
    the microstrip line is configured such that the corresponding grounding conductor is disposed near the one principal surface in the region; and
    the circuit element includes a high-frequency circuit, and is disposed adjacent to the one principal surface of the resin multilayer substrate.

11. The electronic apparatus according to claim 9, wherein
    the resin multilayer substrate includes a region in which one principal surface of the resin multilayer substrate is mountain-folded;
    the microstrip line is configured such that the corresponding grounding conductor is disposed near the one principal surface in the region; and the circuit element includes a metal body, and is disposed adjacent to the other principal surface of the resin multilayer substrate.

12. The electronic apparatus according to claim 9, wherein
the resin multilayer substrate includes a region in which one principal surface of the resin multilayer substrate is valley-folded and a region in which the one principal surface is mountain-folded; and
the microstrip line is configured such that the line conductor is disposed near the other principal surface of the resin multilayer substrate at a side opposite to a side of the one principal surface in the region in which the one principal surface is mountain-folded and the region in which the one principal surface is valley-folded; and
a radius of curvature of the resin multilayer substrate is greater in the region in which the one principal surface is valley-folded than in the region in which the one principal surface is mountain-folded.

13. The electronic apparatus according to claim 9, wherein:
the pair of grounding conductors included in the triplate line include a first grounding conductor and a second grounding conductor; and
the microstrip line includes:
a first microstrip line in which the first grounding conductor opposes the line conductor; and
a second microstrip line in which the second grounding conductor opposes the line conductor.

14. The electronic apparatus according to claim 9, wherein a reduced thickness portion is provided at a position where the microstrip line is provided.

15. The electronic apparatus according to claim 9, wherein:
the pair of grounding conductors include a first grounding conductor and a second grounding conductor; and
in the triplate line,
the first grounding conductor includes a plurality of openings arranged along the line conductor;
the second grounding conductor opposes the line conductor over an entire area of the line conductor;
a width of the line conductor is increased at positions where the line conductor opposes corresponding ones of the plurality of openings; and
a distance between the first grounding conductor and the line conductor is smaller than a distance between the second grounding conductor and the line conductor.

16. The electronic apparatus according to claim 9, wherein the plurality of resin layers include via holes and via-hole conductors provided in the via holes.

17. The electronic apparatus according to claim 16, wherein pad conductors are provided on the plurality of resin layers to cover the via holes.

18. The electronic apparatus according to claim 9, wherein one of the pair of grounding conductors extends over an entire area or substantially an entire area of the triplate line.

19. The electronic apparatus according to claim 9, wherein one of the pair of grounding conductors extends over an entire area or substantially an entire area of the triplate line and the microstrip line.

* * * * *